United States Patent [19]

Stiglich

[11] 4,392,065
[45] Jul. 5, 1983

[54] ELECTRONIC CIRCUIT FOR ELIMINATING CHATTER

[75] Inventor: Ralph E. Stiglich, Cedar Crest, N. Mex.

[73] Assignee: Honeywell Inc., Minneapolis, Minn.

[21] Appl. No.: 275,004

[22] Filed: Jun. 18, 1981

[51] Int. Cl.³ .............................................. H03K 17/56
[52] U.S. Cl. ............................. 307/247 A; 307/247 R; 340/365 E
[58] Field of Search ...................... 307/247 R, 247 A; 340/365 E

[56] References Cited

U.S. PATENT DOCUMENTS

| | | |
|---|---|---|
| 3,989,960 | 11/1976 | Kodama ........................... 307/247 A |
| 4,057,738 | 11/1977 | Nishimura . | |
| 4,073,131 | 2/1978 | Takase et al. .................... 307/247 A |
| 4,159,497 | 6/1979 | Hilliard, Jr. et al. . | |
| 4,185,210 | 1/1980 | Zuk . | |
| 4,198,579 | 4/1980 | Ebihara et al. .................. 307/247 A |
| 4,281,259 | 7/1981 | Ozawa ............................. 307/247 A |

Primary Examiner—Stanley D. Miller
Assistant Examiner—B. P. Davis
Attorney, Agent, or Firm—Clyde C. Blinn

[57] ABSTRACT

An electronic circuit for eliminating chatter in an output circuit due to contact bounce of switches connected to an input circuit. The electronic circuit has a first and second group of D-flip-flop gates which have outputs for providing a signal to a third group of D-flip-flop gates when triggered by a clock signal when the inputs switch contact bounce has terminated.

10 Claims, 1 Drawing Figure

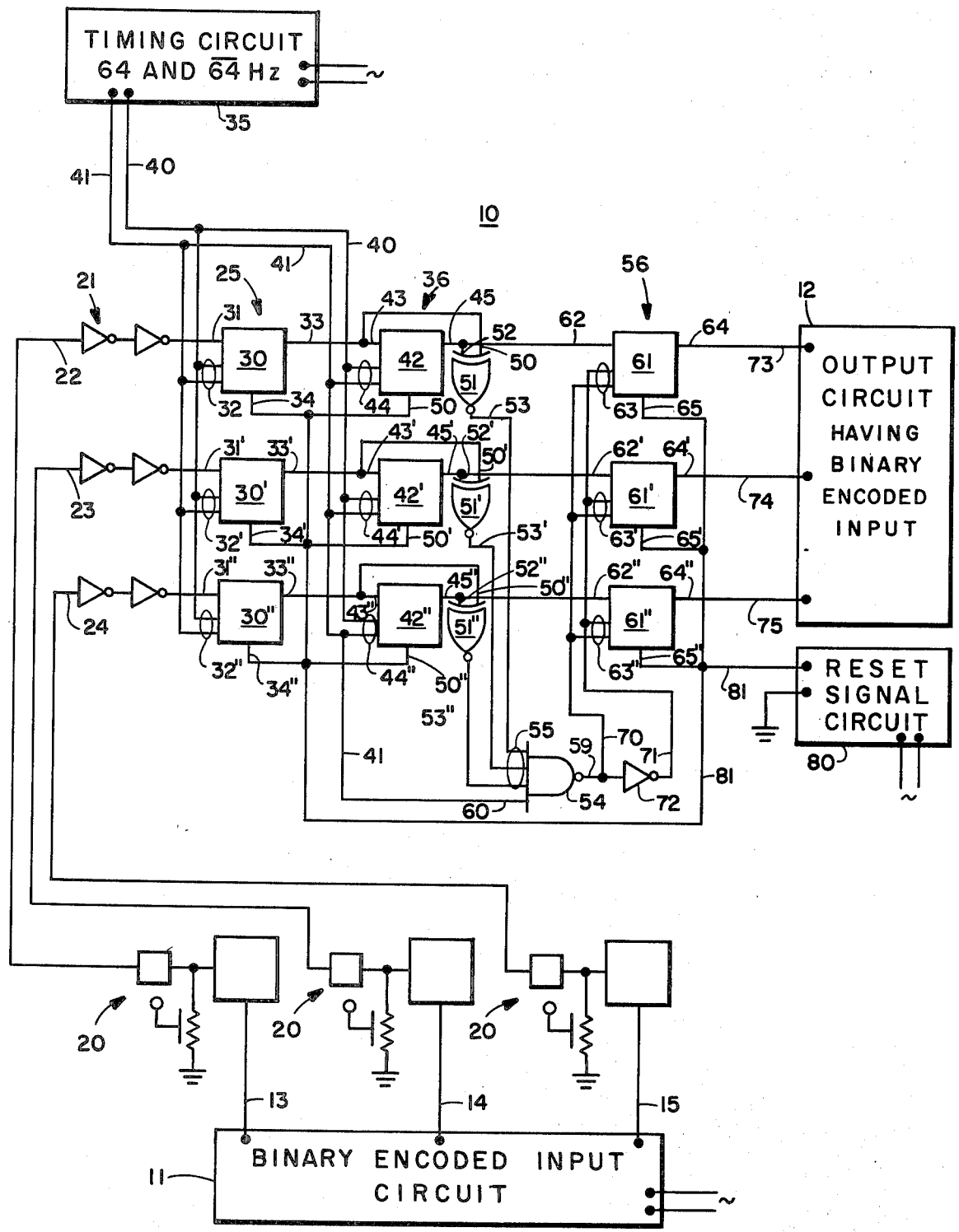

ELECTRONIC CIRCUIT FOR ELIMINATING CHATTER

BACKGROUND AND SUMMARY OF THE INVENTION

The effect of contact bounce of switches on the output of an electronic circuit has been a problem for a considerable time. Many types of electronic circuits have been invented for eliminating chatter in the output of an electronic circuit due to the contact bounce of input switches. Several circuits are disclosed in U.S. Pat. No. to Yukuo Kodama, U.S. Pat. No. 3,989,960, issued Nov. 2, 1976; to Izuhiko Nishimura, U.S. Pat. No. 4,057,738, issued Nov. 8, 1977; to Milton E. Hilliard, Jr., and Daniel J. Provine, U.S. Pat. No. 4,159,497, issued June 26, 1979; and to Borys Zuk, U.S. Pat. No. 4,185,210, issued Jan. 22, 1980.

The present invention is concerned with electronic circuit having a pair of switch means whose outputs are compared periodically upon the command of a clock signal so that upon a switch connected to the input of one of the switch means must reach a steady state operation with no contact bounce before the output of the comparison to coincide with the input signal is provided. Specifically, the invention is applicable with at least a pair of input signals to provide a binary code upon the operation of the switches in the input circuit. The output is provided after the contact bounce has terminated. The invention is even more applicable to a three input circuit which can generate eight functions of binary code where greater error can result for providing no change in the output until the input switches have returned to a stable state.

BRIEF DESCRIPTION OF THE DRAWINGS

The single FIGURE is a circuit diagram of the electronic circuit having a three input binary coded input circuit for providing a three circuit binary coded output.

DESCRIPTION OF THE PREFERRED EMBODIMENT

Referring to the single FIGURE, an electronic circuit 10 eliminates the effect of contact bounce of an input signal from an input switch means 11 on an output circuit 12. Input circuit 11 might be slide switches or membrane keyboards used to generate a binary code over input circuits 13, 14 and 15 connected to conventional voltage generating circuits 20, and to the input of electronic circuit 10 by conductors 22, 23 and 24. Circuits 20 drop the input voltage when any one of the input switches of circuit 11 are open. Circuit 20 has a plurality of diodes at 21 for gate oxide protection as described in the RCA Application Note ICN6218 of the RCA Solid Stage Data Book SSD203A, 1973 Edition.

Circuit 10 has a first group 25 of switch means 30, 30' and 30" of the D-flip-flop gate type, specifically Motorola Type No. MC14013B. Each of the switch means of the first group has two input circuits 31 and 32, an output circuit 33, and a reset circuit 34 which are labeled using the same prime and double prime code. Specifically, input circuit 32 is made up of two circuits connected to a timing circuit or source of clock timing pulses 35 which has two outputs 40 and 41 for providing the 64 Hz and $\overline{64}$ Hz signals or the clock timing pulse signals at different voltages, such as 5 volts and 0.

A second group 36 of switch means 42, 42' and 42" also have two input circuits 43 and 44 and output circuit 45, and a reset circuit 50.

The inputs 31, 31' and 31" of the first group of switch means are connected to the input conductors 22, 23 and 24, and the outputs 33, 33' and 33" are connected to the inputs 43, 43' and 43" of the second group of switch means 42 as well as to the input 50 of another group of switch means 51. Switch means 51 might be conventional exclusive NOR gates of the type manufactured by Motorola, Inc., Part No. MC14077B, which have two inputs 50 and 52, and an output 53. The input 52 is connected to the output of the gate 42.

Another switch means or gate 54, having a plurality of inputs 55 and 60 is similar to a Motorola NAND gate MC14012B which, upon all the input signals being positive, a negative output exists on the output 59. Inputs 55 are connected to the outputs of the switch means 51 and input 60 is connected to the timing circuit 41.

Another group 56 of switch means 61, similar to switch means 30 and 42, have input circuits 62 and 63, an output circuit 64 and a reset circuit 65. Each of the finput circuits 62 of gate 61 are connected to the output 45 of gate 42 and the input 63 is connected to the output of switch means 54 to provide the 64 and $\overline{64}$ Hz timing pulse signals over conductors 70 and 71 by an inverter 72 of the type manufactured by Motorola, Inc., Part No. MC14049B. The output 64 of each of the switch means 61 is connected over conductors 73, 74 and 75 to provide the binary encoded input to the output circuit 12.

A reset signal is available from the reset signal circuit 80 over a conductor 81 which is connected to each of the reset inputs of the gates 30, 42 and 61 to selectively reset the flip-flop circuits after the circuit is initially powered up to place the circuit 10 back in the normal condition.

Operation of the Preferred Embodiment

The binary coded signal over conductors 13, 14 and 15 from the input circuit 11 might be provided by any type of switch means which has contact bounce. To eliminate the contact bounce, circuit 10 prevents the binary coded signal from entering the input of the output circuit 12 over conductors 73, 74 and 75, until the contacts of the switch means have stabilized so a true binary coded signal as produced in the input circuit 11 is transmitted to the output circuit 12. Assuming that there is no signal over conductors 22, 23 and 24, and the gates of groups 25, 36 and 56 are reset to have no output, a binary encoded input of 111 is generated from input circuit 11. Normally, due to contact bounce, without circuit 10, output circuit 12 would receive one or more of the following codes: 001, 010, 011, 100, 101, and 110. With the circuit 10, a debounce time range from 1.5/clock frequency to 2.5/clock frequency and thus with a 64 Hz clock frequency the times are 24 milliseconds to 40 milliseconds.

Let us assume that, due to the contact bounce, gates 30, 30' and 30" receive an input at the input circuit 31 of 100 at the time the timing pulse was received by circuit 32. The output of the group of gates 30 would be 100. At the next timing pulse, if the bounce had terminated, the input to gates 30, 30' and 30" would be 111; however, while the exclusive NOR gate 51 would provide an output, the exclusive NOR gate 51' and 51" would receive different outputs as gates 30' and 42' upon receiving the next clock pulse would provide a 1 and a 0 output to the input of gate 51'. At the next timing pulse, the exclusive NOR gate 51 would all be operative and the NAND gate 54 would allow a timing pulse to the gate 61 to provide the output to the output circuit 12 similar to the 111 binary input at 21.

The embodiments of the invention in which an exclusive property or right is claimed are defined as follows:

1. An electronic circuit for eliminating from at least two input switches the effect of contact bounce, comprising a first group of a first and a second switch means each having two input circuits and one output circuit whereby upon an identical input signal appearing on said two input circuits an output signal exists on said output circuit, first circuit means connecting each of the two input switches providing an input signal to one of said two input circuits of said first and second switch means, a source of timing pulses connected to the other of said two input circuits of said first and second switch means, a second group of a third and fourth switch means each having two input circuits and one output circuit whereby upon an identical input signal appearing on said two input circuits an output signal exists on said output circuit, second circuit means connecting each of said one output circuits of said first and second switch means to one of said input circuits of said third and fourth switch means, third circuit means connecting said source of timing pulses to a second of said two input circuits of said third and fourth switch means, fifth and sixth switch means having two input circuits and an output circuit whereby upon an input signal appearing on each of said two input circuits an output signal exists on said output circuit, fourth circuit means connecting said output circuit of said first and third switch means to one of said input circuits of said fifth switch means and said output circuit of said second and fourth switch means to said input circuits of said sixth switch means, a seventh switch means having at least three input circuits and an output circuit whereby upon identical input signals appearing on all three input circuits, an output signal exists on said output circuit, fifth circuit means connecting said output circuits of each of said fifth and sixth switch means to a first and second input circuits of said seventh switch means and said source of timing pulses to a third input circuit of said seventh switch means, a third group of an eighth and ninth switch means each having two input circuits and an output circuit, whereby upon an identical input signal appearing on each of said two input circuits an output signal exists on said output circuit, and means connecting said output of each of said third and fourth switch means to one of said input circuits of said eighth and ninth switch means respectively and said output circuit of said seventh switch means to each of the other input circuits of said eighth and ninth switch means to provide an output signal at said output circuits of said eighth and ninth switch means indicative of the input signal of the input switches after the contact bounce of the two input switches has terminated.

2. The invention of claim 1 wherein said first and second switch means are flip-flop gates having a reset input circuit, said output signal on said output circuits doesn't change until one of said input signals is removed and a reset signal applied to said reset input circuit restores said gates to a standby operating condition, said third switch means is an exclusive NOR gate, and said clock pulse source means provides a pulsing voltage of 64 Hz.

3. The invention of claim 1 wherein said first, second, third, fourth, eighth and ninth switch means are D-flip-flop gates each having a reset signal input to which a reset signal source can be selectively connected to restore said gates to a normal state after said output signal of said output circuits of said eighth and ninth gates has been used.

4. The invention of claim 3 wherein, said fifth and sixth switch means are exclusive NOR gates, and said seventh switch means is a NAND gate.

5. The invention of claim 4 wherein said source of clock pules is a cyclic voltage source of a 64 Hz frequency.

6. The invention of claim 5 wherein said input switches provide a binary input to said first and second gates whereby a similar binary output is provided on said output circuits of said eighth and ninth gates.

7. The invention of claim 5 wherein a time delay before said output signal is provided at said output circuits ranges between 24 to 40 milliseconds for 64 Hz pulses from said source of clock pulses.

8. The invention of claim 1 wherein each of said first, second and third groups of switch means has at least three switch means for providing a circuit to delay said output until the signal from a three binary coded input is free of contact bounce.

9. The invention of claim 8 wherein all of said switch means of each of said groups are connected to a reset signal source and said source of clock pulses.

10. The invention of claim 4, comprising inverter means connected to saidf output of said NAND gate, to provide an output from each side of said inverter means to said switch means of said third group.

* * * * *